(12) United States Patent
Kamine

(10) Patent No.: US 7,704,777 B2
(45) Date of Patent: Apr. 27, 2010

(54) METHOD FOR PRODUCING SEMICONDUCTOR DEVICE

(75) Inventor: Tetsuji Kamine, Chino (JP)

(73) Assignee: Seiko Epson Corporation (JP)

( * ) Notice: Subject to any disclaimer, the term of this patent is extended or adjusted under 35 U.S.C. 154(b) by 121 days.

(21) Appl. No.: 11/971,346

(22) Filed: Jan. 9, 2008

(65) Prior Publication Data

US 2008/0182385 A1 Jul. 31, 2008

(30) Foreign Application Priority Data

Jan. 31, 2007 (JP) ............................. 2007-020875

(51) Int. Cl.
H01L 21/00 (2006.01)

(52) U.S. Cl. .............. 438/66; 438/464; 257/E21.328; 257/E21.505

(58) Field of Classification Search ............... 438/782, 438/406, 464, 66; 257/E21.328, E21.6, E21.606, 257/E21.505, E21.704
See application file for complete search history.

(56) References Cited

U.S. PATENT DOCUMENTS

2003/0011738 A1* 1/2003 Akiyama et al. ............ 349/156
2005/0067949 A1* 3/2005 Natarajan et al. ........... 313/504

FOREIGN PATENT DOCUMENTS

| JP | 2004-140383 | 5/2004 |
|---|---|---|
| JP | 2004-327836 | 11/2004 |
| JP | 2005-228824 | 8/2005 |
| JP | 2006-328256 | 12/2006 |

* cited by examiner

Primary Examiner—Caridad M Everhart
(74) Attorney, Agent, or Firm—Harness, Dickey & Pierce, P.L.C.

(57) ABSTRACT

A method for producing a semiconductor device includes bonding a transfer layer disposed on a first substrate to a second substrate and detaching the transfer layer from the first substrate. In bonding the transfer layer disposed on the first substrate to the second substrate, the method further includes placing a seal having a frame shape on a surface of the first substrate on which the transfer layer is disposed or a surface of the second substrate facing the first substrate, placing an adhesive in a region inside the seal, and superposing the surface of the first substrate on which the transfer layer is disposed on the second substrate with the seal and the adhesive. The seal and the adhesive are incompatible with each other. The seal and the adhesive are not cured in the period from placing the seal to superposing the surface of the first substrate on which the transfer layer is disposed on the second substrate.

9 Claims, 4 Drawing Sheets

METHOD FOR PRODUCING SEMICONDUCTOR DEVICE

BACKGROUND

1. Technical Field

The present invention relates to a method for producing a semiconductor device by a transfer technique.

2. Related Art

In recent years, there have been advances in the development of thin, lightweight, freely foldable flexible devices. For example, flexible displays typified by electronic paper have lightness, shock absorbing properties, and flexibility such that they conform to hands and thus can be electronic devices that play a role in a ubiquitous society. As such electronic devices, a device including a thin-film element, such as a thin-film transistor, formed on a flexible plastic substrate using a transfer technique is known, as disclosed in, for example, JP-A-2004-140383.

In a transfer process according to the related art, a separation layer is formed on a glass substrate serving as a transfer-source substrate. A thin-film element, which is a transfer layer, is formed thereon by a normal step. The transfer-source substrate is bonded to a plastic substrate, which is a transfer-target substrate, with an adhesive. The adhesion between the separation layer and the transfer-source substrate is reduced using light, heat, or the like. The transfer layer is transferred to the transfer-target substrate. The transfer of the transfer layer to the plastic substrate may be performed through two or more transfer steps. For example, in JP-A-2004-327836, the transfer layer is transferred from the transfer-source substrate to a glass substrate, which is a first transfer-target substrate. Then the transfer layer is transferred to a plastic substrate, which is a second transfer-target substrate. Thereby, the stacking relationship of the transfer layer provided on the transfer-source substrate can be reproduced on the transfer-target substrate.

In such electronic devices, the distance between the transfer-target substrate and the transfer layer is defined by the thickness of the adhesive. Thus, the thickness of the adhesive is required to be uniform in the entire transfer region. For example, a liquid adhesive is used to bond (superpose) the transfer-source substrate to the transfer-target substrate. In this case, although both substrates are planned to be superposed parallel to each other, the substrates may be tilted due to nonuniform weight distribution. The transfer layer held by the adhesive cured while the substrates are tilted is not arranged so as to have a uniform height from the plane of the transfer-target substrate, thereby possibly causing various problems in mounting. In particular, these problems become pronounced when the substrates are large.

To overcome these problems, JP-A-2004-327836 discloses a process of forming a surrounding member having a uniform thickness around a region to which an adhesive is applied and charging the adhesive thereinto. The surrounding member is composed of a material capable of uniformly forming the surrounding member and having sufficient strength such that the spacing can be temporarily maintained. JP-A-2004-327836 discloses the surrounding member formed of a nitride film or an oxide film having a uniform thickness formed by known CVD or sputtering or the surrounding member formed by patterning a resin film using photolithography.

SUMMARY

In CVD or sputtering, however, a prolonged period of time is generally required to achieve a necessary thickness. In photolithography, a mask used for patterning the surrounding member is required. For example, to bond the transfer-source substrate to the transfer-target substrate with sufficient strength, the adhesive needs to have a thickness of about 10 to 100 μm. It is impossible to uniformly form the surrounding member having such a thickness by CVD or sputtering. Alternatively, an epoxy resin formed into a frame-like shape by printing may be used as the surrounding member. In this case, an additional step is required to cure the surrounding member. A process of applying the adhesive without curing the surrounding member is proposed. However, the epoxy resin constituting the surrounding member and an acrylic resin typically used as the adhesive dissolve each other. Thus, if the adhesive is applied without curing, sufficient adhesion is not achieved between the transfer-source substrate and the transfer-target substrate, in some cases. Furthermore, the strength of the surrounding member (seal) is reduced before curing. Thus, when the transfer-source substrate and the transfer-target substrate are superposed, the surrounding member may be broken, so that the adhesive flows out.

An advantage of some aspects of the invention is that it provides a method for producing a semiconductor device, the method including simply transferring a transfer layer to a transfer-target substrate, and it provides a highly reliable electronic apparatus including the semiconductor device at low cost.

To overcome the above-described problems, a method according to an aspect of the invention for producing a semiconductor device includes bonding a transfer layer disposed on a first substrate to a second substrate, and detaching the transfer layer from the first substrate. In bonding the transfer layer disposed on the first substrate to the second substrate, the method further includes placing a seal having a frame shape on a surface of the first substrate on which the transfer layer is disposed or a surface of the second substrate facing the first substrate, placing an adhesive in a region inside the seal, and superposing the surface of the first substrate on which the transfer layer is disposed on the second substrate with the seal and the adhesive. The seal and the adhesive are incompatible with each other. The seal and the adhesive are not cured in the period from placing the seal to superposing the surface of the first substrate on which the transfer layer is disposed on the second substrate. According to this method, since the seal and the adhesive are incompatible with each other, both the seal and the adhesive are not dissolved when the transfer layer is superposed on the second substrate. Thus, the transfer layer can be strongly bonded to the second substrate. Furthermore, the strength of the seal is not reduced. Thus, pressure generated when the substrates are superposed on each other does not cause the adhesive to break the seal. The seal need not be cured before the substrates are superposed on each other, thereby simplifying the steps and reducing the production costs. As described above, according to the aspect of the invention, a highly reliable semiconductor device and electronic apparatus can be provided at low cost.

The phrase "transfer layer" defined here refers to a thin-film transistor, a diode, a resistor, an inductor, a capacitor, another active or passive element, a circuit (chip) such as an integrated circuit having a predetermined function, part of a circuit including a combination of a plurality of elements, the whole or a part of a device having a predetermined function obtained by a combination of one or more circuits such as integrated circuits. The configuration, shape, and size of the transfer layer are not limited.

According to the aspect of the invention, each of the seal and the adhesive may be disposed on either of the first substrate and the second substrate. When the transfer layer is degraded by the seal or the adhesive, the seal and the adhesive are preferably disposed on a substrate on which the transfer layer is not disposed.

In accordance with an embodiment of the invention, the number of times the transfer layer is transferred is not limited to one. The first substrate may be a transfer-source substrate or a transfer-target substrate. That is, the phrase "first substrate including the transfer layer" includes a transfer-source substrate having the transfer layer and a transfer-target substrate having the transfer layer. The phrase "transfer-source substrate" refers to a substrate formed of at least one transferring body. The phrase "transfer-target substrate" refers to an object to which the transfer layer is transferred. Each of the transfer-source substrate and the transfer-target substrate need not necessarily have a flat-plate shape but may have a spherical shape or the like. Furthermore, each of the transfer-source substrate and the transfer-target substrate need not necessarily have stiffness but may be a flexible film that does not have stiffness.

It is preferable that the method further include after bonding the transfer layer to the second substrate, detaching the transfer layer from the first substrate, bonding the surface of the transfer layer detached from the first substrate to a third substrate, detaching the transfer layer from the second substrate, and removing the adhesive attached to the surface of the transfer layer detached from the second substrate. The adhesive is a water-soluble adhesive. In this case, a solvent need not be used in removing the adhesive, thereby minimizing influence on the environment.

It is preferable that the difference $|\sigma_1 - \sigma_2|$ between the solubility parameter $\sigma$ ($\sigma_1$) of the main component constituting the seal and the solubility parameter $\sigma$ ($\sigma_2$) of the main component constituting the adhesive be two or more, the solubility parameter being represented by Formula (1), wherein the expression "main component" refers to a component in which the content of the component constitutes 40% or more of the seal or the adhesive and is the highest content among contents of components in the seal or the adhesive. In this case, the compatibility between the seal and the adhesive can be reduced. The application of the adhesive and the superposition of the substrates can be performed without the curing and drying of the seal.

(Formula 1) (1)

$$\sigma = \sqrt{\frac{\Delta E^V}{V}}$$

(wherein $\Delta E^V$ represents evaporation energy (kcal/mol); and V represents molecular volume (cm³/mol)).

The phrase "solubility parameter" refers to a substance-specific parameter shown in the Hildebrand equation represented by Formula (2). $\Delta E_M$ in Formula (2) is important to speculate on miscibility (solubility) of two liquids. Typically, it is speculated that miscibility decreases with increasing absolute value of $\Delta E_M$ and that miscibility increases with decreasing absolute value of $\Delta E_M$.

(Formula (2)) (2)

$$\Delta E_M = \frac{(n_1 V_1 n_2 V_2)}{(n_1 V_1 + n_2 V_2)} \times \left(\sqrt{\sigma_1} - \sqrt{\sigma_2}\right)$$

(wherein $\Delta E_M$ represents energy required for mixing, and n represents the number of moles).

The solubility parameter is also referred to as an SP value. Miscibility (solubility) between two components can be determined in part by the difference of the SP values. It is believed that when the difference of SP values of two components is one or less, the two components are easily miscible and that when the difference is more than one, the two components are not easily miscible. For example, the SP value of water is 23. The SP value of hexane is 7.2. Thus, water is incompatible with hexane. In accordance with an embodiment of the invention, since the difference of SP values of the seal and the adhesive is two or more, both the seal and the adhesive are dissolved very little. That is, they are practically incompatible.

It is preferable that the solubility parameter $\sigma$ ($\sigma_1$) of the seal be eight or less. Typically, the SP value of an acrylic resin or the like that can be used as an adhesive is 10 or more. Thus, when the seal has an SP value of eight or less, the difference of the SP values of the seal and the adhesive is two or more. In this case, the seal is incompatible with the adhesive. The use of the seal composed of a special material having a low SP value expands the range of material choices of the adhesive. Thus, an appropriate material can be selected in view of the relation to the transfer layer. For example, in the case where the transfer layer is composed of a low-moisture-resistant material, the selection of a high-gas-barrier adhesive provides a highly reliable semiconductor device and an electronic apparatus.

It is preferable that the seal be a silicone adhesive. Silicone adhesives have very low SP values. Acrylic resins and the like commonly used as adhesives typically have 10 or more. Thus, a large difference of SP values between silicone adhesives and acrylic resins can be achieved. For example, the SP value of silicone rubber mainly constituting a silicone adhesive and having a polysiloxane structure is 7.3 to 7.5. The SP values of other silicone adhesives are about 8 or less.

It is preferable that the method include after superposing the surface of the first substrate on which the transfer layer is disposed on the second substrate with the seal and the adhesive, curing the seal and the adhesive by a common curing process. In the case where both the seal and the adhesive are ultraviolet-curable resins, i.e., both the seal and the adhesive are curable by the same process, the curing of only the adhesive without the curing of the seal may complicate the process. In such a case, the seal and the adhesive are simultaneously cured to simplify the production process.

It is preferable that the curing of the seal and the adhesive be performed by ultraviolet irradiation. This results in a reduction in damage to the transfer layer compared with the case where curing is performed by heat treatment or the like.

It is preferable that the method include after superposing the surface of the first substrate on which the transfer layer is disposed on the second substrate, curing the adhesive without curing the seal. This is because the seal merely functions as a surrounding member used for surrounding the adhesive and should be removed in the downstream process. In this case, the seal is not cured. Thus, the seal can be easily removed by rinsing or the like after the transfer layer is transferred, thereby simplifying the production process, improving productivity, and reducing costs.

It is preferable that the seal contain a gap material that maintains a gap between the first substrate and the second substrate. In this case, the thickness of the adhesive is uniform.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described below with reference to the attached drawings. Such embodiments represent exemplary aspects of the invention and do not limit the invention. Exemplary shapes and combinations of components are described in the following embodiments. The shapes and combinations of the components may be changed on the basis of design requirement without departing from the gist of the invention. In the following drawings, for the purpose of clarity, components are shown at different scales and in different numbers.

FIGS. 1A to 5 are explanatory drawings of a method for producing a substrate as a semiconductor device used for an active-matrix electro-optical panel according to an embodiment of the invention. The substrate for the electro-optical panel is used as a device substrate for use in an electro-optical panel according to an embodiment of an electronic apparatus. In FIGS. 1A to 5, only components required in the production process of the substrate used for the electro-optical panel are shown, and accessory components such as a color filter are omitted.

Figure 1A:
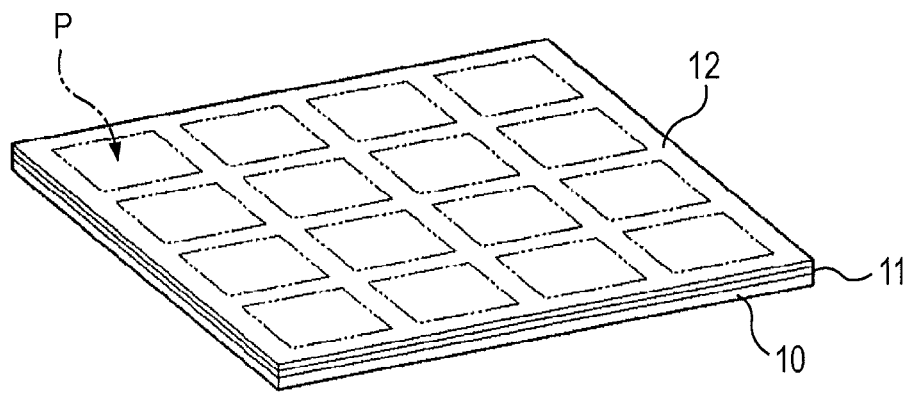
FIGS. 1A to 1C are explanatory drawings of a method for producing a substrate used for an electro-optical panel.

As shown in FIG. 1A, in a method for producing a substrate used for an electro-optical panel according to this embodiment, a separation layer 11 and a transfer layer 12 are formed on a transfer-source substrate 10. The transfer-source substrate 10 is a large substrate including panel regions P for a plurality of electro-optical panels. The transfer-source substrate 10 is a light-transmitting substrate composed of glass, quartz, plastic, or the like. The transfer-source substrate 10 may hold the transfer layer 12 without change during transfer. The transfer-source substrate 10 may be a flexible film that does not stiffness but needs to have heat resistance so as to withstand a processing temperature of the transfer layer 12. For example, let the maximum temperature during formation of the transfer layer 12 be Tmax. The transfer-source substrate 10 preferably has a strain point (glass transition temperature Tg or softening point) equal to or higher than Tmax. In the case where the transfer layer 12 including a low-temperature polysilicon semiconductor sublayer is formed, the transfer-source substrate 10 preferably has a strain point of 350° C. or higher and more preferably 500° C. or higher.

Energy is applied to the separation layer 11 to cause separation (hereinafter, referred to as "intra-layer separation" or "boundary separation") inside the layer or at a boundary of the layer. Preferably, the binding force between atoms or molecules constituting the separation layer 11 is eliminated or reduced by light irradiation, in other words, ablation occurs to result in intra-layer separation or boundary separation. In some cases, light irradiation results in the generation of a gas from the separation layer 11 to facilitate separation. That is, a component contained in the separation layer 11 turns into a gas, and the gas is released. Alternatively, the separation layer 11 absorbs light to turn into a gas for a moment, and the vapor is released to contribute to separation. The separation layer 11 may be composed of amorphous silicon, hydrogenated amorphous silicon, nitrogen-doped amorphous silicon, a hydrogen-containing alloy, a nitrogen-containing alloy, multiple layers, a ceramic material, a metal, an organic polymer, and a known material disclosed in JP-A-2004-327836.

For example, the transfer layer 12 may be a circuit including an active element, such as a thin-film transistor, a passive element, or a combination thereof. The transfer layer 12 may be a single element, a chip such as an integrated circuit having an independent function, or part of a circuit which does not have an independent function but functions independently in combination with another element or a circuit. Thus, the structure and size thereof are not limited. The transfer layer 12 may include elements or circuits having the same function, elements or circuits having different functions, or different types of elements or circuits.

In any case, the transfer layer 12 is formed on the same substrate and can be formed by a similar production process. Examples of such a thin-film element include thin-film transistors, thin-film diodes, photoelectric conversion elements including a silicon PIN junction such as optical sensors and solar cells, silicon resistive elements, other thin-film semiconductor devices, electrodes, switching elements, memory, actuators such as piezoelectric elements, micromirrors (piezoceramic thin film and the like, thin-film magnetic recording heads, coils, inductors, resistors, capacitors, high-permeability thin films, micromagnetic devices formed by combining them, filters, reflective films, and dichroic mirrors.

The transfer layer 12 includes a plurality of transfer areas corresponding to the plurality of panels P. Each individual transfer area includes a thin-film element having a pixel circuit with a plurality of pixel switching elements arrayed in a matrix and a peripheral driving circuit, such as a data-line-driving circuit and a scan-line-driving circuit, disposed around the pixel circuit. In this embodiment, each of the pixel switching element and the peripheral driving circuit includes a thin-film transistor having a low-temperature polysilicon semiconductor layer. These components are integrally formed on the same substrate to constitute an electro-optical panel with a built-in peripheral driving circuit.

Figure 1B:
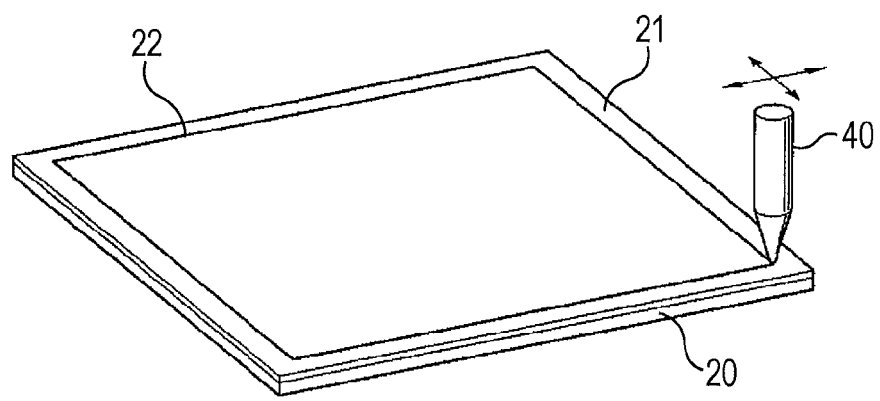

As shown in FIG. 1B, a separation layer 21 and a seal 22 are formed on a first transfer-target substrate 20. The first transfer-target substrate 20 is a large substrate including panels P for a plurality of electro-optical panels. The first transfer-target substrate 20 is a light-transmitting substrate composed of glass, quartz, plastic, or the like. The first transfer-target substrate 20 may maintain the shape thereof and hold the transfer layer 12 without change during transfer. The first transfer-target substrate 20 may be a flexible film that does not stiffness.

The first transfer-target substrate 20 may have heat resistance and corrosion resistance inferior to those of the transfer-source substrate 10. Unlike the transfer-source substrate 10, properties required for the first transfer-target substrate 20, in particular, heat resistance of the first transfer-target substrate 20 is independent of the temperature conditions during the formation of the transfer layer. Let the maximum temperature in forming the transfer layer 12 be Tmax. The first transfer-target substrate 20 may have a strain point (glass transition temperature Tg or softening point) equal to or lower than Tmax.

Energy is applied to the separation layer 21 to cause separation (hereinafter, referred to as "intra-layer separation" or "boundary separation") inside the layer or at a boundary of the layer. Preferably, the binding force between atoms or molecules constituting the separation layer 21 is eliminated or reduced by light irradiation, in other words, ablation occurs to result in intra-layer separation or boundary separation. The separation layer 21 may be composed of the same material as that of the separation layer 11.

The seal 22 is formed so as to surround the periphery of the panel regions P and has a closed frame shape along the sides of the first transfer-target substrate 20. Preferably, the seal 22 is composed of a material having a solubility parameter σ (SP value) significantly different from that of an adhesive 23 (described below with reference to FIG. 1C) placed within the frame of the seal 22. The material, the composition, the main component, and the like of the seal 22 are appropriately selected in view of a combination with the adhesive 23. In this embodiment, the seal 22 is composed of silicone rubber functioning as an ultraviolet-curable silicone adhesive because the silicone adhesive usually has a low SP value and is not easily mixed with another adhesive such as a commonly-used acrylic adhesive and the like. The seal 22 having a thickness of about 10 μm to 20 μm is formed by a known printing apparatus 40 such as a dispenser.

The solubility parameter serves as an indicator of the solubility of a two-component solution. The solubility parameter is also referred to as an SP value. Miscibility (solubility) between two components can be determined in part by the difference of the SP values. It is believed that when the difference of SP values of two components is one or less, the two components are easily miscible and that when the difference is more than one, the two components are not easily miscible. The silicone adhesive used in this embodiment has a very low SP value. Thus, a large difference of SP values between the silicone adhesive and an acrylic resin or the like commonly used as an adhesive (SP value: 10 or more) can be achieved. For example, silicone rubber, which is a type of silicone adhesive, has an SP value of 7.3 to 7.5. The SP values of other silicone adhesives are about 8 or less. The use of the seal 22 composed of a material having a very low SP value expands the range of material choices of the adhesive 23 placed within the frame of the seal 22. Thus, it is possible to select the adhesive 23 having an appropriate composition in relation to the transfer layer.

Preferably, a hydrogen-bondable functional group is not contained in the seal 22 or the adhesive 23, or both. Preferably, the chemical structure of the seal 22 is dissimilar from that of the adhesive 23. If they can be hydrogen-bonded or are similar in chemical structure, they may be compatible even when the SP values are very different. Preferably, each of the materials constituting the seal 22 and the adhesive 23 has a large molecular volume.

The viscosity of the seal 22 is appropriately adjusted in response to an application process of the adhesive 23 and in order to achieve a target height of the seal 22. To maintain a sufficient height, the viscosity is preferably 20 Pa·s or more. The seal 22 may contain a gap material that maintains the height of the seal 22 at a predetermined level. The gap material refers to a paste including minute chips, microparticles, or fibers dispersed therein. Silica microparticles, plastic microparticles, glass fibers, and the like can be used. The type and quantity of the gap material may be appropriately adjusted in response to the purpose of use, the material of the seal 22, and the like.

Figure 1C:
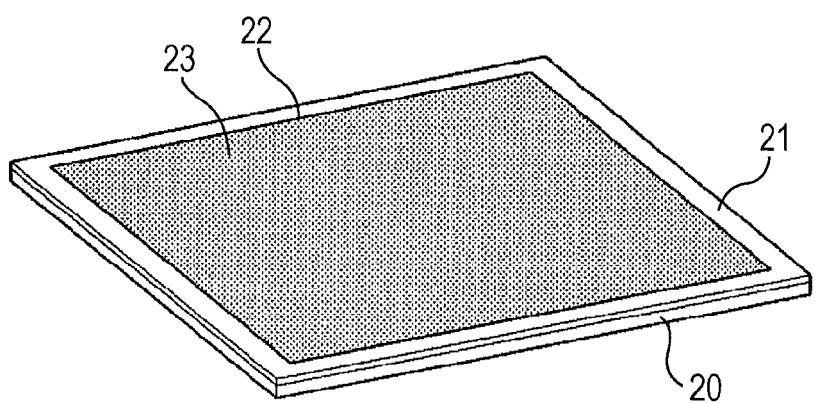

After the seal 22 is formed on the first transfer-target substrate 20, the adhesive 23 is applied to a region within the frame of the seal 22 as shown in FIG. 1C. Examples of the type of the adhesive 23 include reactive adhesives, thermosetting adhesives, photocurable adhesives such as ultraviolet-curable adhesives, anaerobic adhesives, and other curable adhesives. Specific examples thereof include acrylic adhesives, epoxy adhesives, silicone adhesives, natural rubber adhesives, polyurethane adhesives, phenolic adhesives, vinyl acetate adhesives, cyano acrylate adhesives, polyvinyl alcohol adhesives, polyimide adhesives, and polyamide adhesives. These may be tailored to application purposes.

In the case where transfer is performed at least two times, preferably, the adhesive 23 can be easily removed in the process. This is because the adhesive 23 is removed in the course of the process when transfer is performed at least two times. For example, even after polymerization (curing) is performed by a predetermined process, the adhesive 23 is preferably removed with water, an organic solvent, or the like so as not to cause contamination or corrosion of a device. A polyvinyl alcohol or a water-soluble acrylic polymer is preferably used in order that the adhesive 23 is soluble in water.

The adhesive 23 is preferably composed of a material having a solubility parameter σ (SP value) significantly different from that of the seal 22. The material, the composition, the main component, and the like of the adhesive 23 are appropriately selected in view of a combination with the seal 22. Table 1 shows an exemplary combination of the adhesive 23 with the seal 22.

TABLE 1

| Seal 22 | Adhesive 23 |
| --- | --- |
| Silicone adhesive | Acrylic adhesive |
| Silicone adhesive | Polyvinyl pyrrolidone adhesive |
| Silicone adhesive | Polyvinyl alcohol adhesive |

The adhesive 23 is applied by printing with a known printing apparatus such as a liquid ejecting apparatus. In this embodiment, the adhesive 23 is applied to a region within the frame of the seal 22 using an ink jet apparatus, which is a type of liquid ejecting apparatus. Specifically, the appropriately selected ultraviolet-curable water-soluble acrylic adhesive 23 is uniformly ejected from a nozzle of the ink jet apparatus to a region within the frame of the seal 22 while the nozzle is moved within the frame of the seal 22.

After the adhesive 23 is charged into a region surrounded by the frame of the seal 22, bubbles in the adhesive 23 are preferably removed before the transfer-source substrate 10 is superposed on the first transfer-target substrate 20 (described below with reference to FIG. 2A). Specifically, after the adhesive 23 is applied, the bubbles are removed under reduced pressure, and then the substrates are superposed. This prevents transfer failure due to bubble inclusions, the breakage of the transfer layer 12 due to the transfer failure during separation, disconnection, malfunction, and the like.

Figure 2A:
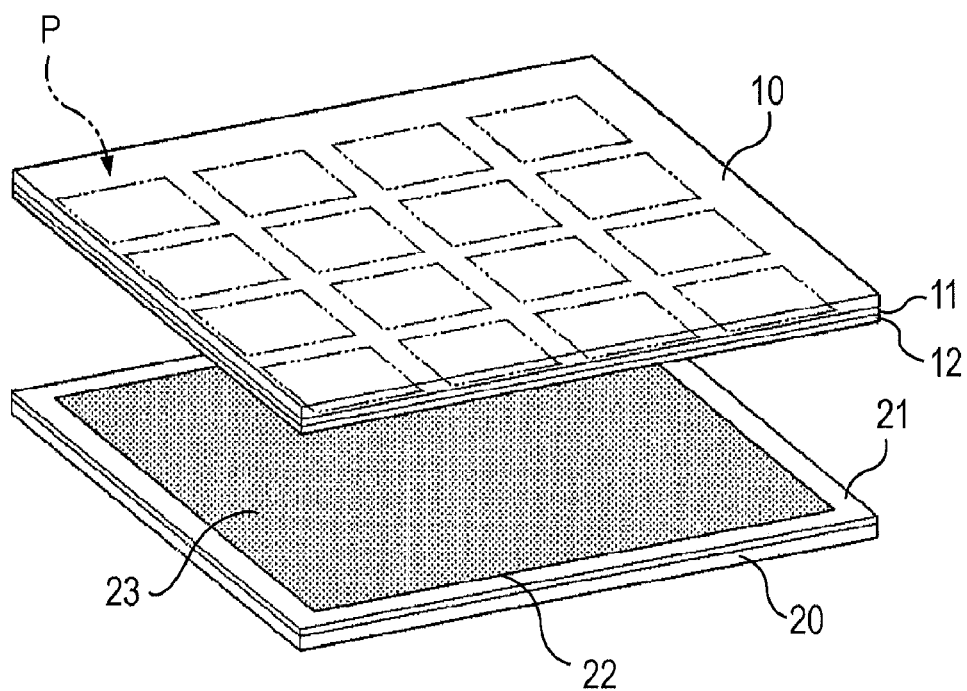
FIGS. 2A and 2B are explanatory drawings of a method for producing a substrate used for an electro-optical panel.
Figure 2B:
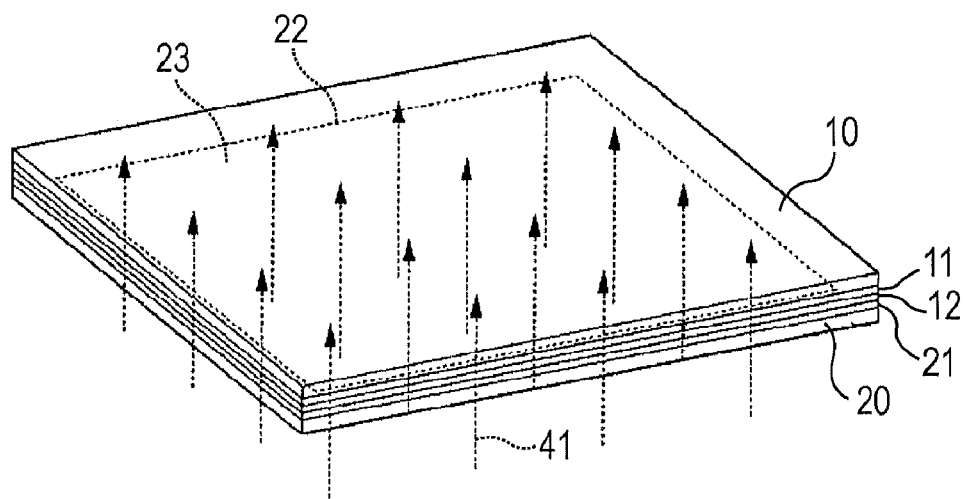

As shown in FIG. 2A, the transfer-source substrate 10 and the first transfer-target substrate 20 are positioned and superposed with the adhesive 23 and the seal 22 provided therebetween in such a manner that the panel regions P of the transfer-source substrate 10 are superposed on the panel regions P of the first transfer-target substrate 20. As shown in FIG. 2B, the adhesive 23 and the seal 22 are cured by irradiation with ultraviolet rays 41 from the first transfer-target substrate 20 side. The curing is determined depending on the type of the adhesive 23. In this embodiment, an ultraviolet and moisture curing adhesive is used as the adhesive 23 and the seal 22. Thus, ultraviolet irradiation is performed as the curing. If a thermosetting adhesive is used, the adhesive 23 is gradually cured by increasing the temperature of the whole substrate or irradiation with laser light or microwaves to increase the temperature of part of the substrate.

The seal 22 need not necessarily be cured. Only the adhesive 23 may be cured without the curing of the seal 22. The seal 22 functions merely as a surrounding member used for surrounding the adhesive 23 and should be removed in the downstream process. In the case where the curing of the adhesive 23 alone is difficult in the process or complicates the process, preferably, the seal 22 and the adhesive 23 are simultaneously cured.

Preferably, the two substrates 10 and 20 are temporarily fixed by an external force so as not to be relatively moved until the curing of the adhesive 23 is completed. An example of a process of temporarily fixing the substrates involves press-bonding the substrates by applying a pressure in the direction of the normal to the substrates to increase adhesion between the substrates. In this case, the seal 22 is not cured and can flow. Thus, there is a possibility that the seal 22 will be compressed during press bonding to reduce the volume within the frame, and then the seal 22 will be broken, so that the adhesive 23 will flow out. In this case, the incorporation of the gap material in the seal 22 suppresses a reduction in volume and prevents the adhesive 23 from flowing out. Even when the gap material is incorporated, the pressure applied during press bonding is preferably controlled in view of physical properties of the seal 22 and the gap material in such a manner that the seal 22 is not broken or the gap material does not collapse. To achieve a uniform thickness of the adhesive, a jig used for press bonding preferably has sufficiently planarized bonding surfaces without irregularities in order to uniformly apply pressure to the substrates.

Figure 3A:
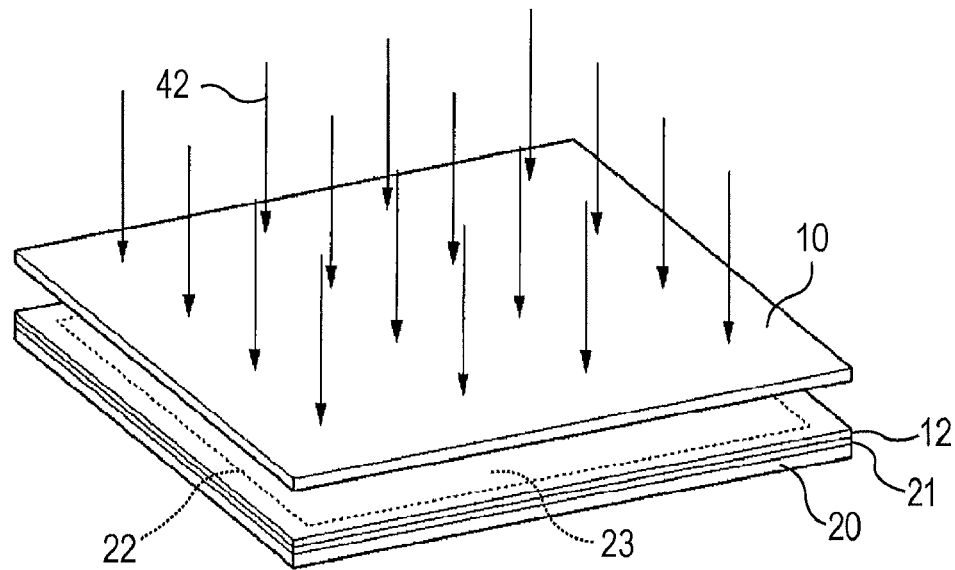
FIGS. 3A and 3B are explanatory drawings of a method for producing a substrate used for an electro-optical panel.

After the adhesive 23 is cured, as shown in FIG. 3A, the separation layer 11 (see FIG. 1A) is irradiated with light 42 from the transfer-source substrate 10 side, thereby reducing the adhesion of the separation layer 11. When the separation layer 11 is irradiated with the light 42, separation (intra-layer separation or boundary separation) occurs. The occurrence of the intra-layer separation or the boundary separation is attributed to the occurrence of ablation in the constituent of the separation layer 11, the evolution of a gas contained in the separation layer 11, and a phase change, such as melting or vaporization, generated immediately after irradiation.

The term "ablation" means that a constituent of the separation layer 11 which absorbs the irradiated light is photochemically or thermally excited, so that bonds between atoms or molecules on the surface and inside of the constituent are broken to emit the constituent. Ablation appears as a phenomenon in which the phase change, such as melting or vaporization, in the whole or part of the constituent of the separation layer 11 occurs. Furthermore, the phase change may form microbubbles, thereby reducing a binding force. Whether intra-layer separation, boundary separation, or both occur in the separation layer 11 depends on the composition of the separation layer 11 and various other factors. Examples of the factors include conditions such as the type, wavelength, intensity, and penetration depth of irradiating light.

As the irradiating light 42, any light may be used as long as it causes intra-layer separation or boundary separation in the separation layer 11. Examples thereof include X-rays, ultraviolet rays, visible light, infrared rays (heat rays), laser light, millimeter waves, microwaves, electron beams, and radiation (α wave, β wave, and γ wave) Among these, laser light is preferred in view that the separation (ablation) of the separation layer 11 is easily induced and that local irradiation can be achieved with high precision. Laser light is coherent light and thus suitable for the generation of separation at a target portion with high precision by irradiating the separation layer 11 with high-power pulsed light through the transfer-source substrate 10. Therefore, the transfer layer 12 can be detached easily and reliably using laser light.

Examples of an apparatus for generating laser light include various types of gas laser and solid-state laser (semiconductor laser). Excimer laser, Nd-YAG laser, Ar laser, $CO_2$ laser, CO laser, He—Ne laser, and the like may be suitably used. Laser light having a wavelength of 100 nm to 350 nm is preferred. The use of short-wavelength laser light results in an increase in the accuracy of light irradiation and an effective separation in the separation layer 11. As such short-wavelength laser light, excimer laser may be used. Excimer laser can generate ablation in the separation layer 11 in a very short time without an increase in the temperature of the transfer-source substrate 10, thereby preventing degradation and damage to the transfer layer 12.

After the binding force of the separation layer 11 is reduced, a force is applied in such a manner that the transfer-source substrate 10 is detached from the first transfer-target substrate 20. As a result, the transfer-source substrate 10 is detached from the first transfer-target substrate 20. After detachment, residues of the separation layer 11 are attached on the bottom of the transfer layer 12 or the surface of the first transfer-target substrate 20, in some cases. To completely remove the residues, a method appropriately selected from, for example, rinsing, etching, ashing, polishing, and a combination thereof may be employed.

After transfer, the seal 22 left on the first transfer-target substrate 20 is preferably removed by an appropriate method, such as etching, ashing, polishing, or a combination thereof, in response to the process before or after the removal of the remaining separation layer. Specifically, a portion to which the seal 22 is applied may be removed by cutting or a physical or chemical method.

Figure 3B:
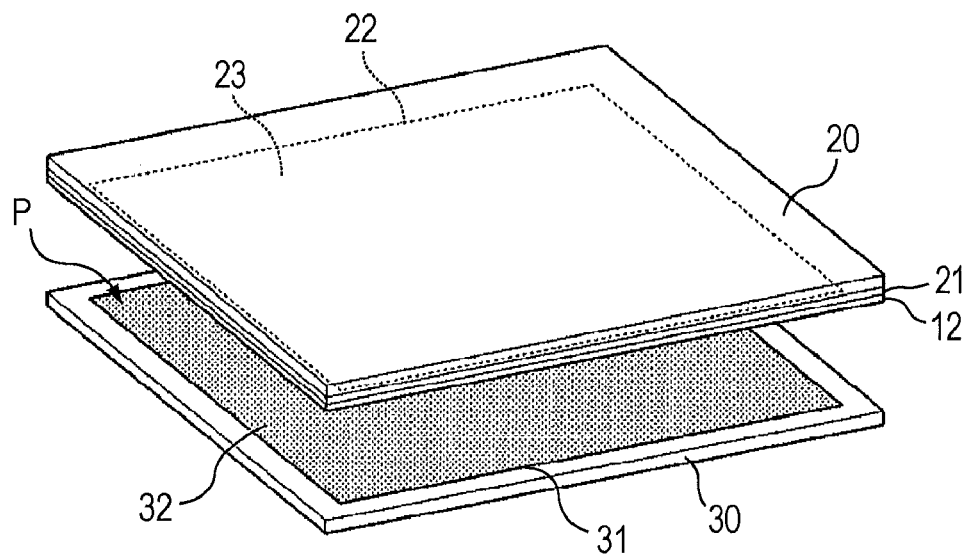

After the transfer layer 12 is transferred to the first transfer-target substrate 20, as shown in FIG. 3B, the first transfer-target substrate 20 is superposed on a second transfer-target substrate 30 with an adhesive 32.

The second transfer-target substrate 30 is a large substrate including panel regions P for a plurality of electro-optical panels. The second transfer-target substrate 30 is a light-transmitting substrate composed of glass, quartz, plastic, stainless steel, or the like. The second transfer-target substrate 30 may maintain the shape thereof and hold the transfer layer 12 without change during transfer. The second transfer-target substrate 30 may be a flexible film that does not stiffness. Paper, wood, or the like may be used. The second transfer-target substrate 30 may have heat resistance and corrosion resistance inferior to those of the transfer-source substrate 10. Unlike the transfer-source substrate 10, properties required for the second transfer-target substrate 30, in particular, heat resistance of the second transfer-target substrate 30 is independent of the temperature conditions during the formation of the transfer layer. Let the maximum temperature in forming the transfer layer 12 be Tmax. The second transfer-target substrate 30 may have a strain point (glass transition temperature Tg or softening point) equal to or lower than Tmax.

A seal 31 is formed on the second transfer-target substrate 30. The seal 31 is formed so as to surround the periphery of the panel regions P and has a closed frame shape along the sides of the second transfer-target substrate 30. Preferably, the seal 31 is composed of a material having a solubility parameter σ (SP value) significantly different from that of the adhesive 32 placed within the frame of the seal 31. The material, the composition, the main component, and the like of the seal 31 are appropriately selected in view of a combination with the adhesive 32. In this embodiment, the seal 31 is composed of silicone rubber functioning as an ultraviolet-curable silicone adhesive. The seal 31 having a thickness of about 10 μm to 20 μm is formed by a known printing apparatus such as a dispenser.

Preferably, a hydrogen-bondable functional group is not contained in the seal 31 or the adhesive 32, or both. Preferably, the chemical structure of the seal 31 is dissimilar from that of the adhesive 32. If they can be hydrogen-bonded or are similar in chemical structure, they may be compatible even when the SP values are very different. Preferably, each of the materials constituting the seal 31 and the adhesive 32 has a large molecular volume.

The viscosity of the seal 31 is appropriately adjusted in response to an application process of the adhesive 23 and in order to achieve a target height of the seal 31. To maintain a sufficient height, the viscosity is preferably 20 Pa·s or more. The seal 31 may contain a gap material that maintains the height of the seal 31 at a predetermined level. The gap material refers to a paste including minute chips, microparticles, or fibers dispersed therein. Silica microparticles, plastic microparticles, glass fibers, and the like can be used. The type and quantity of the gap material may be appropriately adjusted in response to the purpose of use, the material of the seal 31, and the like.

Examples of the type of the adhesive 32 include reactive adhesives, thermosetting adhesives, photocurable adhesives such as ultraviolet-curable adhesives, anaerobic adhesives, and other curable adhesives. Specific examples thereof include acrylic adhesives, epoxy adhesives, silicone adhesives, natural rubber adhesives, polyurethane adhesives, phenolic adhesives, vinyl acetate adhesives, cyano acrylate adhesives, polyvinyl alcohol adhesives, polyimide adhesives, and polyamide adhesives. These may be tailored to application purposes.

After the adhesive 32 is charged into a region surrounded by the frame of the seal 31, bubbles in the adhesive 32 are preferably removed before the first transfer-target substrate 20 is superposed on the second transfer-target substrate 30. Specifically, after the adhesive 32 is applied, the bubbles are removed under reduced pressure, and then the substrates are superposed. This prevents transfer failure due to bubble inclusions, the breakage of the transfer layer 12 due to the transfer failure during separation, disconnection, malfunction, and the like.

Figure 4A:
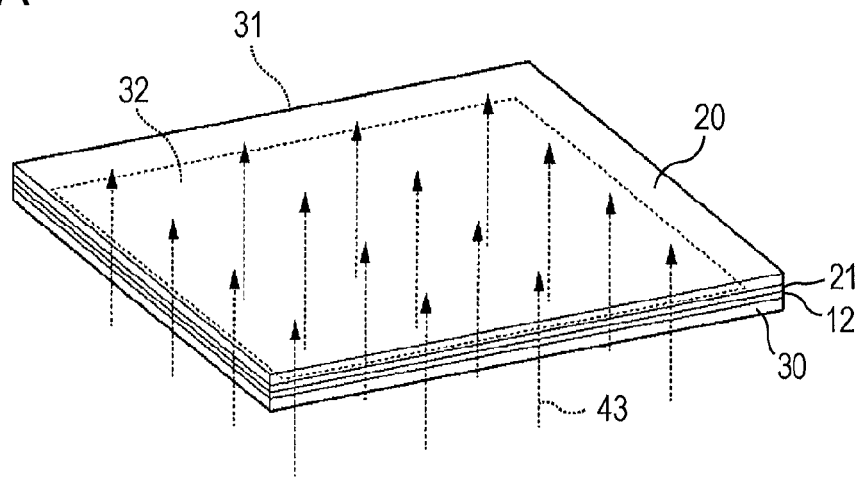
FIGS. 4A and 4B are explanatory drawings of a method for producing a substrate used for an electro-optical panel.

The first transfer-target substrate 20 and the second transfer-target substrate 30 are positioned and superposed in such a manner that the panel regions P of them are superposed. As shown in FIG. 4A, the adhesive 32 and the seal 31 are cured by irradiation with ultraviolet rays 43 from the second transfer-target substrate 30 side. The curing is determined depending on the type of the adhesive 32. In this embodiment, an ultraviolet-curable adhesive is used as the adhesive 32 and the seal 31. Thus, ultraviolet irradiation is performed as the curing. If a thermosetting adhesive is used, the adhesive 32 is gradually cured by increasing the temperature of the whole substrate or irradiation with laser light or microwaves to increase the temperature of part of the substrate.

Figure 4B:
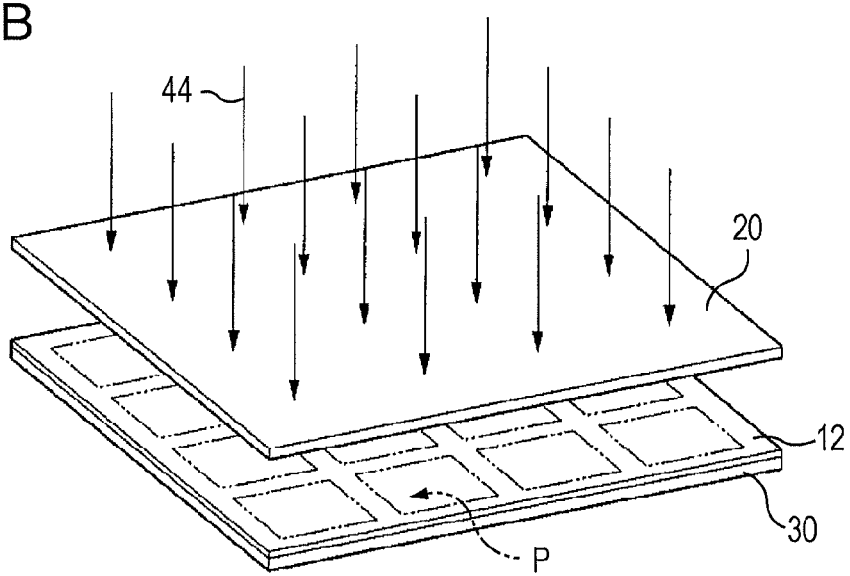

After the adhesive 32 is cured, as shown in FIG. 4B, the separation layer 21 (see FIG. 4A) is irradiated with light 44 from the first transfer-target substrate 20 side, thereby reducing the adhesion of the separation layer 21. When the separation layer 21 is irradiated with the light 44, separation (intra-layer separation or boundary separation) occurs. The occurrence of the intra-layer separation or the boundary separation is attributed to the occurrence of ablation in the constituent of the separation layer 21, the evolution of a gas contained in the separation layer 21, and a phase change, such as melting or vaporization, generated immediately after irradiation.

After the binding force of the separation layer 21 is reduced, a force is applied in such a manner that the first transfer-target substrate 20 is detached from the second transfer-target substrate 30. As a result, the first transfer-target substrate 20 is detached from the second transfer-target substrate 30. After detachment, residues of the separation layer 21 are attached on the surface of the transfer layer 12, in some cases. To completely remove the residues, a method appropriately selected from, for example, rinsing, etching, ashing, polishing, and a combination thereof may be employed.

The adhesive 23 attached to the surface of the transfer layer 12 is removed by a method such as rinsing, etching, ashing, polishing, or a combination thereof. In this embodiment, the adhesive 23 is a water-soluble adhesive. Thus, a solvent need not be used in removing the adhesive 23, thereby minimizing influence on the environment.

Figure 5:
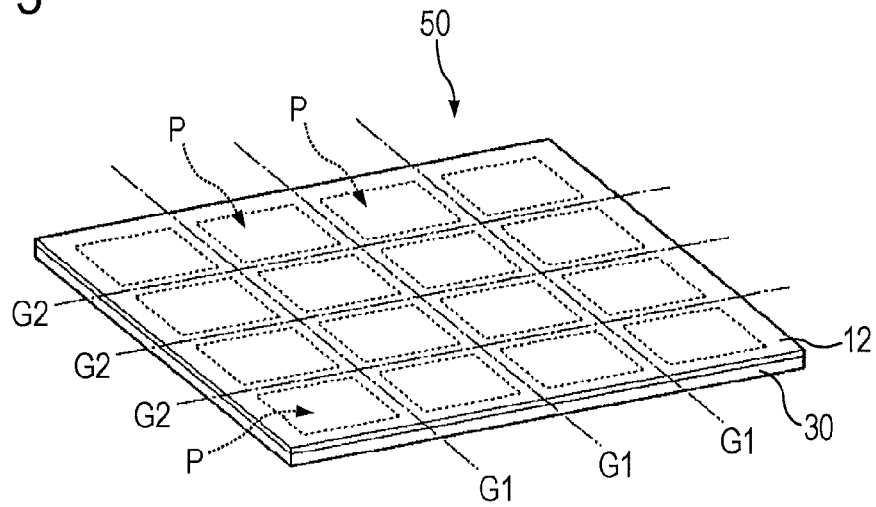
FIG. 5 is an explanatory drawing of a method for producing a substrate used for an electro-optical panel.

Thereby, the transfer layer 12 is transferred to the second transfer-target substrate 30. FIG. 5 shows a schematic structure of a substrate 50 used for an electro-optical panel, the substrate 50 including the transfer layer 12 disposed on the second transfer-target substrate 30. The substrate 50 is cut along cutting lines G1 and G2 shown by the dotted lines into pieces corresponding to the panel regions P. The substrate 50 is used as a device substrate used for an electro-optical panel. For example, in the case where a liquid crystal apparatus as an electro-optical panel is produced, a substrate for an electro-optical panel is superposed on an opposite substrate. A liquid crystal material is charged into a space between the substrates. The substrate 50 may be cut before or after the production of an electro-optical panel. In the resulting electro-optical panel, any substrate such as a plastic substrate as the second transfer-target substrate 30 may be used. Thus, the electro-optical panel may be applied to a flexible electronic apparatus such as electronic paper. The transfer layer 12 is formed on a substrate, such as a glass substrate, having a high strain point. Thus, a thin-film element that needs to be formed by a process such as a polysilicon process performed at a relatively high processing temperature can be formed. Thereby, a high-performance electro-optical panel can be provided.

As described above, in this embodiment, the seal and the adhesive are incompatible with each other. Thus, the seal and the adhesive do not dissolve each other when the substrates are superposed on each other. Hence, the separation layer 21 can be bonded to the substrate. Furthermore, the strength of the seal is not reduced. Thus, the seal is not broken by a pressure generated in superposing the substrates. Moreover, the seal need not be cured before the substrates are superposed, thereby simplifying the process to reduce production costs. According to this embodiment, a highly reliable electro-optical panel can be provided at low costs.

In this embodiment, the case in which transfer is performed two times is described. However, the number of times of transfer is not limited to two. Also in the case where the number of times of transfer is one as disclosed in JP-A-10-125931, the invention may be applied. In this embodiment, the seal 22 and the adhesive 23 are arranged on the first transfer-target substrate 20 when the first transfer-target substrate 20 is superposed on the transfer-source substrate 10. Alternatively, each of the seal 22 and the adhesive 23 may be arranged on either of the first transfer-target substrate 20 and the transfer-source substrate 10. Similarly, when the second transfer-target substrate 30 is superposed on the first transfer-target substrate 20, each of the seal 31 and the adhesive 32 may be arranged on either of the second transfer-target substrate 30 and the transfer-source substrate 10.

EXAMPLE

A transfer layer was transferred from a transfer-source substrate to a first transfer-target substrate according to the method described in the above-described embodiment. A seal composed of silicone rubber was used. An adhesive composed of a water-soluble acrylic adhesive was used. The seal had an SP value of 7.2 to 7.5. The SP value of the adhesive was estimated to be 10.1 by calculating the SP value of a main component (constituting 60% to 70% of the adhesive) of the adhesive by the Fedors method. In this case, the transfer layer was successfully transferred without the curing of the seal.

COMPARATIVE EXAMPLE

Although the same adhesive as in EXAMPLE was used, the seal was an ultraviolet-curable epoxy adhesive. Transfer was performed as in EXAMPLE. The SP value of the seal was estimated to be 9.7 to 10.9 by calculating the SP value of a main component (constituting 50% to 75% of the seal) of the seal by the Fedors method. In this case, in charging the adhesive, the seal dissolved in the adhesive. As a result, the adhesive could not be enclosed.

What is claimed is:

1. A method for producing a semiconductor device, comprising:
    bonding a transfer layer disposed on a first substrate to a second substrate; and
    detaching the transfer layer from the first substrate,
    wherein in bonding the transfer layer disposed on the first substrate to the second substrate, the method further comprises:
        placing an uncured seal having a frame shape either on a surface of the first substrate on which the transfer layer is disposed or on a surface of the second substrate facing the first substrate;
        placing an uncured adhesive in a region inside the uncured seal;
        superposing the surface of the first substrate on which the transfer layer is disposed on the second substrate with the uncured seal and the uncured adhesive; and
        curing the uncured adhesive after superposing the surface of the first substrate on which the transfer layer is disposed on the second substrate,
    wherein the uncured seal and the uncured adhesive are incompatible with each other, and
    the uncured seal and the uncured adhesive are not cured in the period from placing the uncured seal to superposing the surface of the first substrate on which the transfer layer is disposed on the second substrate.

2. The method according to claim 1, further comprising:
    after bonding the transfer layer to the second substrate, detaching the transfer layer from the first substrate;
    bonding the surface of the transfer layer detached from the first substrate to a third substrate;
    detaching the transfer layer from the second substrate; and
    removing the adhesive attached to the surface of the transfer layer detached from the second substrate,
    wherein the adhesive is a water-soluble adhesive.

3. The method according to claim 1, further comprising:
    after superposing the surface of the first substrate on which the transfer layer is disposed on the second substrate, curing the adhesive without curing the seal.

4. The method according to claim 1,
    wherein the seal contains a gap material that maintains a gap between the first substrate and the second substrate.

5. The method according to claim 1,
    wherein a solubility parameter is expressed as Formula (1):

(Formula 1) (1)

$$\sigma = \sqrt{\frac{\Delta E^V}{V}}$$

(wherein $\Delta E^V$ represents evaporation energy (kcal/mol); and V represents molecular volume (cm$^3$/mol)),
    wherein the difference $|\sigma_1-\sigma_2|$ between the solubility parameter $\sigma(\sigma_1)$ of the main component constituting the seal and the solubility parameter $\sigma(\sigma_2)$ of the main component constituting the adhesive is two or more, and
    wherein the expression "main component" refers to a component in which the content of the component constitutes 40% or more of the seal or the adhesive and is the highest content among contents of components in the seal or the adhesive.

6. The method according to claim 5,
    wherein the solubility parameter $\sigma(\sigma_1)$ of the seal is 8 or less.

7. The method according to claim 6,
    wherein the seal is a silicone adhesive.

8. The method according to claim 1, further comprising:
    after superposing the surface of the first substrate on which the transfer layer is disposed on the second substrate with the seal and the adhesive, curing the seal and the adhesive by a common curing process.

9. The method according to claim 8,
    wherein the curing of the seal and the adhesive is performed by ultraviolet irradiation.

* * * * *